(12) United States Patent
Honea et al.

(10) Patent No.: US 8,816,751 B2
(45) Date of Patent: *Aug. 26, 2014

(54) INDUCTIVE LOAD POWER SWITCHING CIRCUITS

(71) Applicant: Transphorm Inc., Goleta, CA (US)

(72) Inventors: James Honea, Santa Barbara, CA (US); Yifeng Wu, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/959,483

(22) Filed: Aug. 5, 2013

(65) Prior Publication Data

US 2013/0320939 A1 Dec. 5, 2013

Related U.S. Application Data

(63) Continuation of application No. 13/618,726, filed on Sep. 14, 2012, now Pat. No. 8,531,232, which is a continuation of application No. 12/556,438, filed on Sep. 9, 2009, now Pat. No. 8,289,065.

(60) Provisional application No. 61/099,451, filed on Sep. 23, 2008.

(51) Int. Cl.
*H03K 17/56* (2006.01)

(52) U.S. Cl.
USPC ............ 327/424; 327/423; 327/448; 327/494

(58) Field of Classification Search
USPC .................. 327/365, 374, 392–406, 419–492
See application file for complete search history.

(56) References Cited

U.S. PATENT DOCUMENTS

| | | |
|---|---|---|
| 4,384,287 A | 5/1983 | Sakuma |
| 4,645,562 A | 2/1987 | Liao et al. |
| 4,728,826 A | 3/1988 | Einzinger et al. |
| 4,808,853 A | 2/1989 | Taylor |
| 4,821,093 A | 4/1989 | Iafrate et al. |
| 4,914,489 A | 4/1990 | Awano |
| 5,198,964 A | 3/1993 | Ito et al. |
| 5,329,147 A | 7/1994 | Vo et al. |
| 5,379,209 A | 1/1995 | Goff |
| 5,493,487 A | 2/1996 | Close et al. |
| 5,637,922 A | 6/1997 | Fillion et al. |
| 5,646,069 A | 7/1997 | Jelloian et al. |

(Continued)

FOREIGN PATENT DOCUMENTS

| | | |
|---|---|---|
| CN | 1320298 | 10/2001 |
| CN | 1682445 | 10/2005 |

(Continued)

OTHER PUBLICATIONS

CN Office Action in Application No. 200980137436.2, issued Sep. 10, 2013, 12 pages.

(Continued)

*Primary Examiner* — Brandon S Cole
(74) *Attorney, Agent, or Firm* — Fish & Richardson P.C.

(57) ABSTRACT

Power switching circuits including an inductive load and a switching device are described. The switches devices can be either low-side or high-side switches. Some of the switches are transistors that are able to block voltages or prevent substantial current from flowing through the transistor when voltage is applied across the transistor.

34 Claims, 9 Drawing Sheets

(56) References Cited

U.S. PATENT DOCUMENTS

| | | |
|---|---|---|
| 5,705,847 A | 1/1998 | Kashiwa et al. |
| 5,714,393 A | 2/1998 | Wild et al. |
| 5,789,951 A * | 8/1998 | Shen et al. ............... 327/110 |
| 5,952,856 A | 9/1999 | Horiguchi et al. |
| 5,998,810 A | 12/1999 | Hatano et al. |
| 6,008,684 A | 12/1999 | Ker et al. |
| 6,097,046 A | 8/2000 | Plumton |
| 6,107,844 A | 8/2000 | Berg et al. |
| 6,130,831 A | 10/2000 | Matsunaga |
| 6,172,550 B1 | 1/2001 | Gold et al. |
| 6,316,793 B1 | 11/2001 | Sheppard et al. |
| 6,333,617 B1 | 12/2001 | Itabashi et al. |
| 6,395,593 B1 | 5/2002 | Pendharkar et al. |
| 6,475,889 B1 | 11/2002 | Ring |
| 6,486,502 B1 | 11/2002 | Sheppard et al. |
| 6,515,303 B2 | 2/2003 | Ring |
| 6,521,940 B1 | 2/2003 | Vu et al. |
| 6,548,333 B2 | 4/2003 | Smith |
| 6,583,454 B2 | 6/2003 | Sheppard et al. |
| 6,586,781 B2 | 7/2003 | Wu et al. |
| 6,649,497 B2 | 11/2003 | Ring |
| 6,650,169 B2 | 11/2003 | Faye et al. |
| 6,727,531 B1 | 4/2004 | Redwing et al. |
| 6,777,278 B2 | 8/2004 | Smith |
| 6,781,423 B1 | 8/2004 | Knoedgen |
| 6,849,882 B2 | 2/2005 | Chavarkar et al. |
| 6,867,078 B1 | 3/2005 | Green et al. |
| 6,900,657 B2 | 5/2005 | Bui et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,045,404 B2 | 5/2006 | Sheppard et al. |
| 7,071,498 B2 | 7/2006 | Johnson et al. |
| 7,084,475 B2 | 8/2006 | Shelton et al. |
| 7,116,567 B2 | 10/2006 | Shelton et al. |
| 7,125,786 B2 | 10/2006 | Ring et al. |
| 7,161,194 B2 | 1/2007 | Parikh et al. |
| 7,170,111 B2 | 1/2007 | Saxler |
| 7,230,284 B2 | 6/2007 | Parikh et al. |
| 7,238,560 B2 | 7/2007 | Sheppard et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,378,883 B1 | 5/2008 | Hsueh |
| 7,388,236 B2 | 6/2008 | Wu et al. |
| 7,419,892 B2 | 9/2008 | Sheppard et al. |
| 7,432,142 B2 | 10/2008 | Saxler et al. |
| 7,443,648 B2 | 10/2008 | Cutter et al. |
| 7,449,730 B2 | 11/2008 | Kuraguchi |
| 7,456,443 B2 | 11/2008 | Saxler et al. |
| 7,465,967 B2 | 12/2008 | Smith et al. |
| 7,477,082 B2 | 1/2009 | Fukazawa |
| 7,501,669 B2 | 3/2009 | Parikh et al. |
| 7,544,963 B2 | 6/2009 | Saxler |
| 7,548,112 B2 | 6/2009 | Sheppard |
| 7,550,783 B2 | 6/2009 | Wu et al. |
| 7,550,784 B2 | 6/2009 | Saxler et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,612,390 B2 | 11/2009 | Saxler et al. |
| 7,612,602 B2 | 11/2009 | Yang et al. |
| 7,615,774 B2 | 11/2009 | Saxler |
| 7,638,818 B2 | 12/2009 | Wu et al. |
| 7,639,064 B2 | 12/2009 | Hsiao et al. |
| 7,678,628 B2 | 3/2010 | Sheppard et al. |
| 7,692,263 B2 | 4/2010 | Wu et al. |
| 7,709,269 B2 | 5/2010 | Smith et al. |
| 7,709,859 B2 | 5/2010 | Smith et al. |
| 7,714,360 B2 | 5/2010 | Otsuka et al. |
| 7,719,055 B1 | 5/2010 | McNutt et al. |
| 7,745,851 B2 | 6/2010 | Harris |
| 7,746,020 B2 | 6/2010 | Schnetzka et al. |
| 7,755,108 B2 | 7/2010 | Kuraguchi |
| 7,777,252 B2 | 8/2010 | Sugimoto et al. |
| 7,804,328 B2 | 9/2010 | Pentakota et al. |
| 7,812,369 B2 | 10/2010 | Chini et al. |
| 7,851,825 B2 | 12/2010 | Suh et al. |
| 7,855,401 B2 | 12/2010 | Sheppard et al. |
| 7,875,537 B2 | 1/2011 | Suvorov et al. |
| 7,875,907 B2 | 1/2011 | Honea et al. |
| 7,875,914 B2 | 1/2011 | Sheppard |
| 7,884,395 B2 | 2/2011 | Saito |
| 7,892,974 B2 | 2/2011 | Ring et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,906,837 B2 | 3/2011 | Cabahug et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,920,013 B2 | 4/2011 | Sachdev et al. |
| 7,928,475 B2 | 4/2011 | Parikh et al. |
| 7,955,918 B2 | 6/2011 | Wu et al. |
| 7,960,756 B2 | 6/2011 | Sheppard et al. |
| 7,965,126 B2 | 6/2011 | Honea et al. |
| 7,985,986 B2 | 7/2011 | Heikman et al. |
| 8,013,580 B2 | 9/2011 | Cervera et al. |
| 8,049,252 B2 | 11/2011 | Smith et al. |
| 2001/0032999 A1 | 10/2001 | Yoshida |
| 2001/0040247 A1 | 11/2001 | Ando et al. |
| 2002/0036287 A1 | 3/2002 | Yu et al. |
| 2002/0121648 A1 | 9/2002 | Hsu et al. |
| 2002/0125920 A1 | 9/2002 | Stanley |
| 2002/0167023 A1 | 11/2002 | Chavarkar et al. |
| 2003/0006437 A1 | 1/2003 | Mizuta et al. |
| 2003/0020092 A1 | 1/2003 | Parikh et al. |
| 2003/0178654 A1 | 9/2003 | Thornton |
| 2004/0041169 A1 | 3/2004 | Ren et al. |
| 2004/0061129 A1 | 4/2004 | Saxler et al. |
| 2004/0164347 A1 | 8/2004 | Zhao et al. |
| 2004/0178831 A1 | 9/2004 | Li et al. |
| 2005/0052221 A1 | 3/2005 | Kohnotoh et al. |
| 2005/0067716 A1 | 3/2005 | Mishra et al. |
| 2005/0077541 A1 | 4/2005 | Shen et al. |
| 2005/0077947 A1 | 4/2005 | Munzer et al. |
| 2005/0133816 A1 | 6/2005 | Fan et al. |
| 2005/0146310 A1 | 7/2005 | Orr |
| 2005/0189561 A1 | 9/2005 | Kinzer et al. |
| 2005/0189562 A1 | 9/2005 | Kinzer et al. |
| 2005/0194612 A1 | 9/2005 | Beach |
| 2005/0218964 A1 | 10/2005 | Oswald et al. |
| 2005/0253168 A1 | 11/2005 | Wu et al. |
| 2006/0011915 A1 | 1/2006 | Saito et al. |
| 2006/0033122 A1 | 2/2006 | Pavier et al. |
| 2006/0043499 A1 | 3/2006 | De Cremoux et al. |
| 2006/0060871 A1 | 3/2006 | Beach |
| 2006/0102929 A1 | 5/2006 | Okamoto et al. |
| 2006/0108602 A1 | 5/2006 | Tanimoto |
| 2006/0108605 A1 | 5/2006 | Yanagihara et al. |
| 2006/0121682 A1 | 6/2006 | Saxler |
| 2006/0124962 A1 | 6/2006 | Ueda et al. |
| 2006/0157729 A1 | 7/2006 | Ueno et al. |
| 2006/0176007 A1 | 8/2006 | Best |
| 2006/0186422 A1 | 8/2006 | Gaska et al. |
| 2006/0189109 A1 | 8/2006 | Fitzgerald |
| 2006/0202272 A1 | 9/2006 | Wu et al. |
| 2006/0220063 A1 | 10/2006 | Kurachi et al. |
| 2006/0237825 A1 | 10/2006 | Pavier et al. |
| 2006/0238234 A1 | 10/2006 | Benelbar et al. |
| 2006/0255364 A1 | 11/2006 | Saxler et al. |
| 2006/0261473 A1 | 11/2006 | Connah et al. |
| 2006/0289901 A1 | 12/2006 | Sheppard et al. |
| 2007/0007547 A1 | 1/2007 | Beach |
| 2007/0018187 A1 | 1/2007 | Lee et al. |
| 2007/0018199 A1 | 1/2007 | Sheppard et al. |
| 2007/0018210 A1 | 1/2007 | Sheppard |

(56) References Cited

U.S. PATENT DOCUMENTS

| | | |
|---|---|---|
| 2007/0045670 A1 | 3/2007 | Kuraguchi |
| 2007/0080672 A1 | 4/2007 | Yang |
| 2007/0090373 A1 | 4/2007 | Beach et al. |
| 2007/0128743 A1 | 6/2007 | Huang et al. |
| 2007/0132037 A1 | 6/2007 | Hoshi et al. |
| 2007/0134834 A1 | 6/2007 | Lee et al. |
| 2007/0145390 A1 | 6/2007 | Kuraguchi |
| 2007/0146045 A1 | 6/2007 | Koyama |
| 2007/0158692 A1 | 7/2007 | Nakayama et al. |
| 2007/0164315 A1 | 7/2007 | Smith et al. |
| 2007/0164322 A1 | 7/2007 | Smith et al. |
| 2007/0194354 A1 | 8/2007 | Wu et al. |
| 2007/0205433 A1 | 9/2007 | Parikh et al. |
| 2007/0210329 A1 | 9/2007 | Goto |
| 2007/0224710 A1 | 9/2007 | Palacios et al. |
| 2007/0228477 A1 | 10/2007 | Suzuki et al. |
| 2007/0278518 A1 | 12/2007 | Chen et al. |
| 2008/0017998 A1 | 1/2008 | Pavio |
| 2008/0018366 A1 | 1/2008 | Hanna |
| 2008/0073670 A1 | 3/2008 | Yang et al. |
| 2008/0093626 A1 | 4/2008 | Kuraguchi |
| 2008/0121876 A1 | 5/2008 | Otsuka et al. |
| 2008/0122418 A1 | 5/2008 | Briere et al. |
| 2008/0136390 A1 | 6/2008 | Briere |
| 2008/0157121 A1 | 7/2008 | Ohki |
| 2008/0158110 A1 | 7/2008 | Iida et al. |
| 2008/0191342 A1 | 8/2008 | Otremba |
| 2008/0203430 A1 | 8/2008 | Simin et al. |
| 2008/0203559 A1 | 8/2008 | Lee et al. |
| 2008/0230784 A1 | 9/2008 | Murphy |
| 2008/0237606 A1 | 10/2008 | Kikkawa et al. |
| 2008/0237640 A1 | 10/2008 | Mishra et al. |
| 2008/0248634 A1 | 10/2008 | Beach |
| 2008/0272404 A1 | 11/2008 | Kapoor |
| 2008/0274574 A1 | 11/2008 | Yun |
| 2008/0283844 A1 | 11/2008 | Hoshi et al. |
| 2008/0308813 A1 | 12/2008 | Suh et al. |
| 2009/0032820 A1 | 2/2009 | Chen |
| 2009/0032879 A1 | 2/2009 | Kuraguchi |
| 2009/0045438 A1 | 2/2009 | Inoue et al. |
| 2009/0050936 A1 | 2/2009 | Oka |
| 2009/0065810 A1 | 3/2009 | Honea et al. |
| 2009/0072269 A1 | 3/2009 | Suh et al. |
| 2009/0085065 A1 | 4/2009 | Mishra et al. |
| 2009/0167411 A1 | 7/2009 | Machida et al. |
| 2009/0180304 A1 | 7/2009 | Bahramian et al. |
| 2009/0201072 A1 | 8/2009 | Honea et al. |
| 2009/0215230 A1 | 8/2009 | Muto et al. |
| 2009/0218598 A1 | 9/2009 | Goto |
| 2009/0236728 A1 | 9/2009 | Satou et al. |
| 2009/0278513 A1 | 11/2009 | Bahramian et al. |
| 2009/0315594 A1 | 12/2009 | Pentakota et al. |
| 2010/0067275 A1 | 3/2010 | Wang et al. |
| 2010/0073067 A1 | 3/2010 | Honea |
| 2010/0097119 A1 | 4/2010 | Ma et al. |
| 2010/0117095 A1 | 5/2010 | Zhang |
| 2011/0006346 A1 | 1/2011 | Ando et al. |
| 2011/0012110 A1 | 1/2011 | Sazawa et al. |
| 2011/0019450 A1 | 1/2011 | Callanan et al. |
| 2011/0025397 A1 | 2/2011 | Wang et al. |
| 2011/0121314 A1 | 5/2011 | Suh et al. |
| 2011/0169549 A1 | 7/2011 | Wu |
| 2012/0306464 A1* | 12/2012 | Hirler et al. .................. 323/282 |

FOREIGN PATENT DOCUMENTS

| | | |
|---|---|---|
| CN | 1748320 | 3/2006 |
| CN | 101897029 | 11/2010 |
| CN | 101978589 | 2/2011 |
| CN | 102017160 | 4/2011 |
| CN | 102165694 | 8/2011 |
| CN | 102308387 | 1/2012 |
| CN | 103477543 | 12/2013 |
| EP | 1 998 376 | 12/2008 |
| EP | 2 188 842 | 5/2010 |
| EP | 2 243 213 | 10/2010 |
| JP | 5-075040 | 3/1993 |
| JP | 6-067744 | 3/1994 |
| JP | 2000-058871 | 2/2000 |
| JP | 2000-101356 | 4/2000 |
| JP | 2000-124358 | 4/2000 |
| JP | 2003-229566 | 8/2003 |
| JP | 2003-244943 | 8/2003 |
| JP | 2003-338742 | 11/2003 |
| JP | 2004-147472 | 5/2004 |
| JP | 2004-260114 | 9/2004 |
| JP | 2004-281454 | 10/2004 |
| JP | 2005-012051 | 1/2005 |
| JP | 2006-032749 | 2/2006 |
| JP | 2006-033723 | 2/2006 |
| JP | 2006-115557 | 4/2006 |
| JP | 2006-158185 | 6/2006 |
| JP | 2006-173754 | 6/2006 |
| JP | 2007-036218 | 2/2007 |
| JP | 2007-096203 | 4/2007 |
| JP | 2007-143229 | 6/2007 |
| JP | 2007-215331 | 8/2007 |
| JP | 2007-215389 | 8/2007 |
| JP | 2007-252055 | 9/2007 |
| JP | 2007-294769 | 11/2007 |
| JP | 2008-199771 | 8/2008 |
| JP | 2010-539712 | 12/2010 |
| JP | 2011-512119 | 4/2011 |
| JP | 2012-517699 | 8/2012 |
| TW | 200924068 | 6/2009 |
| TW | 200924201 | 6/2009 |
| TW | 200941920 | 10/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201126686 | 8/2011 |
| TW | 201143017 | 12/2011 |
| TW | 201332085 | 8/2013 |
| TW | 201347143 | 11/2013 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/102732 | 8/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/053981 | 5/2011 |
| WO | WO 2011/072027 | 6/2011 |
| WO | WO 2011/085260 | 7/2011 |
| WO | WO 2011/097302 | 8/2011 |
| WO | WO 2013/085839 | 6/2013 |

OTHER PUBLICATIONS

CN Office Action in Application No. 200980110230.0, issued Dec. 3, 2012, 11 pages.

CN Office Action in Application No. 200980110230.0, issued Aug. 1, 2013, 6 pages.

JP Office Action in Application No. 2010-546867, issued Sep. 24, 2013, 14 pages.

Ando et al., "10-W/mm AlGaN-GaN HFET with a field modulating plate," IEEE Electron Device Letters, 2003, 24(5): 289-291.

Arulkumaran et al. (2005), "Enhancement of breakdown voltage by AlN buffer layer thickness in AlGaN/GaN high-electron-mobility transistors on 4 in. diameter silicon," Applied Physics Letters, 86:123503-1-3.

(56) References Cited

OTHER PUBLICATIONS

Authorized officer Chung Keun Lee, International Search Report and Written Opinion in PCT/US2008/076079, mailed Mar. 20, 2009, 11 pp.
Authorized officer Nora Lindner, International Preliminary Report on Patentability in PCT/US2008/076079, mailed Apr. 1, 2010, 6 pp.
Authorized officer Keon Hyeong Kim, International Search Report and Written Opinion in PCT/US2008/076160 mailed Mar. 18, 2009, 11 pp.
Authorized officer Simin Baharlou, International Preliminary Report on Patentability in PCT/US2008/076160, mailed Mar. 25, 2010, 6 pp.
Authorized officer Chung Keun Lee, International Search Report and Written Opinion in PCT/US2008/076199, mailed Mar. 24, 2009, 11 pp.
Authorized officer Dorothée Mülhausen, International Preliminary Report on Patentability in PCT/US2008/076199, mailed Apr. 1, 2010, 6 pp.
Authorized officer Keon Hyeong Kim, International Search Report and Written Opinion in PCT/US2008/085031, mailed Jun. 24, 2009, 11 pp.
Authorized officer Yolaine Cussac, International Preliminary Report on Patentability in PCT/US2008/085031, mailed Jun. 24, 2010, 6 pp.
Authorized officer Jae Woo Wee, International Search Report and Written Opinion in PCT/US2009/033699, mailed Sep. 21, 2009, 11 pp.
Authorized officer Dorothée Mülhausen, International Preliminary Report on Patentability in PCT/US2009/033699, mailed Aug. 26, 2010, 6 pp.
Authorized officer Tae Hoon Kim, International Search Report and Written Opinion in PCT/US2009/041304, mailed Dec. 18, 2009, 13 pp.
Authorized officer Dorothée Mülhausen, International Preliminary Report on Patentability in PCT/US2009/041304, mailed Nov. 4, 2010, 8 pp.
Authorized officer Sung Hee Kim, International Search Report and the Written Opinion in PCT/US2009/057554, mailed May 10, 2010, 13 pp.
Authorized Officer Gijsbertus Beijer, International Preliminary Report on Patentability in PCT/US2009/057554, mailed Mar. 29, 2011, 7 pp.
Authorized officer Cheon Whan Cho, International Search Report and Written Opinion in PCT/US2009/066647, mailed Jul. 1, 2010, 16 pp.
Authorized officer Athina Nickitas-Etienne, International Preliminary Report on Patentability in PCT/US2009/066647, mailed Jun. 23, 2011, 12 pp.
Authorized officer Chung Keun Lee, International Search Report and Written Opinion in PCT/US2009/076030, mailed Mar. 23, 2009, 10 pp.
Authorized officer Yolaine Cussac, International Preliminary Report on Patentability in PCT/US2009/076030, mailed Mar. 25, 2010, 5 pp.
Authorized officer Sung Chan Chung, International Search Report and Written Opinion for PCT/US2010/021824, mailed Aug. 23, 2010, 9 pp.
Authorized officer Beate Giffo-Schmitt, International Preliminary Report on Patentability in PCT/US2010/021824, mailed Aug. 23, 2010, 6 pp.
Authorized officer Sang Ho Lee, International Search Report and Written Opinion in PCT/US2010/034579, mailed Dec. 24, 2010, 9 pp.
Authorized officer Nora Lindner, International Preliminary Report on Patentability in PCT/US2010/034579, mailed Nov. 24, 2011, 7 pp.
Authorized officer Jeongmin Choi, International Search Report and Written Opinion in PCT/US2010/046193, mailed Apr. 26, 2011, 13 pp.
Authorized officer Bon Gyoung Goo, International Search Report and Written Opinion in PCT/US2010/055129, mailed Jul. 1, 2011, 11 pp.
Authorized officer Sang Ho Lee, International Search Report and Written Opinion in PCT/US2010/059486, mailed Jul. 26, 2011, 9 pp.

Authorized officer Kee Young Park, International Search Report and Written Opinion in PCT/US2011/023485, mailed Sep. 23, 2011, 10 pp.
Authorized officer Nora Lindner, International Preliminary Report on Patentability in PCT/US2011/023485, mailed Aug. 16, 2012, 7 pp.
Authorized officer Sung Joon Lee, International Search Report and Written Opinion in PCT/US2011/020592, mailed Sep. 19, 2011, 9 pp.
Authorized officer Philippe Bécamel, International Preliminary Report on Patentability in PCT/US2011/020592, mailed Jul. 19, 2012, 7 pp.
Authorized officer In Gu Kwak, International Search Report and Written Opinion in PCT/US2012/026810, mailed Jan. 23, 2013, 10 pp.
Arulkumaran et al., "Surface passivation effects on AlGaN/GaN high-electron-mobility transistors with $SiO_2$, $Si_3N_4$, and silicon oxynitride," Applied Physics Letters, Jan. 26, 2004, 84(4): 613-615.
Barnett and Shinn (1994), "Plastic and elastic properties of compositionally modulated thin films," Annu. Rev. Mater. Sci., 24:481-511.
Chen et al,, "High-performance AlGaN/GaN lateral field-effect rectifiers compatible with high electron mobility transistors," Jun. 25, 2008, Applied Physics Letters, 92, 253501-1-3.
Chen, et al., "Single-Chip Boost Converter Using Monolithically Integrated AlGan/GaN Lateral Field-Effect Rectifier and Normally Off HEMT," IEEE Electron Device Letters, May 2009, 30(5):430-432.
Cheng et al. (2006), "Flat GaN epitaxial layers grown on Si(111) by metalorganic vapor phase epitaxy using step-graded AlGaN intermediate layers," Journal of Electronic Materials, 35(4):592-598.
Chu et al., "1200-V normally off GaN-on-Si field-effect transistors with low dynamic on-resistance," IEEE Electron Device Letters, 2011, 32(5): 632-634.
Coffie, R.L., "Characterizing and suppressing DC-to-RF dispersion in AlGaN/GaN high electron mobility transistors," 2003, PhD Thesis, University of California, Santa Barbara, 169 pp.
Coffie et al. (2003), "Unpassivated p-GaN/AlGaN/GaN HEMTs with 7.1 W/mm at 10 GhZ," Electronic Letters, 39(19):1419-1420.
Dora et al., "High breakdown voltage achieved on AlGaN/GaN HEMTs with integrated slant field plates," Sep. 9, 2006, IEEE Electron Device Letters, 27(9):713-715.
Dora et al., "$ZrO_2$ gate dielectrics produced by ultraviolet ozone oxidation for GaN and AlGaN/GaN transistors," Mar./Apr. 2006, J. Vac. Sci. Technol. B, 24(2):575-581.
Dora, Y., "Understanding material and process limits for high breakdown voltage AlGaN/GaN HEMs," 2006, PhD Thesis, University of California, Santa Barbara, 157 pp.
Fanciulli et al., "Structural and electrical properties of $HfO_2$ films grown by atomic layer deposition on Si, Ge, GaAs and GaN," 2004, Mat. Res. Soc. Symp. Proc., vol. 786, 6 pp.
Green et al., "The effect of surface passivation on the microwave characteristics of undoped AlGaN/GaN HEMT's," IEEE Electron Device Letters, Jun. 2000, 21(6):268-270.
Gu et al., "AlGaN/GaN MOS transistors using crystalline $ZrO_2$ as gate dielectric," 2007, Proceedings of SPIE, vol. 6473, 64730S-1-8.
Higashiwaki et al., "AlGaN/GaN heterostructure field-effect transistors on 4H-SiC substrates with current-gain cutoff frequency of 190 GHz," Applied Physics Express, 2008, 1:021103-1-3.
Hwang, J., "Effects of a molecular beam epitaxy grown AlN passivation layer on AlGaN/GaN heterojunction field effect transistors," Solid-State Electronics, 2004, 48:363-366.
Im et al., "Normally off GaN MOSFET based on AlGaN/GaN heterostructure with extremely high 2DEG density grown on silicon substrate," IEEE Electron Device Letters, 2010, 31(3):192-194.
Karmalkar and Mishra (2001), "Enhancement of breakdown voltage in AlGaN/GaN high electron mobility transistors using a field plate," IEEE Transactions on Electron Devices, 48(8):1515-1521.
Karmalkar and Mishra, "Very high voltage AlGaN/GaN high electron mobility transistors using a field plate deposited on a stepped insulator," Solid-State Electronics, 2001, 45:1645-1652.
Keller et al. (2002), "GaN–GaN junctions with ultrathin AlN interlayers: expanding heterojunction design," Applied Physics Letters, 80(23):4387-4389.

(56) References Cited

OTHER PUBLICATIONS

Keller et al., "Method for heteroepitaxial growth of high quality N-Face GaN, InN and AlN and their alloys by metal organic chemical vapor deposition," U.S. Appl. No. 60/866,035, filed Nov. 15, 2006, 31 pp.
Khan et al., "AlGaN/GaN metal oxide semiconductor heterostructure field effect transistor," IEEE Electron Device Letters, 2000, 21(2):63-65.
Kim, D.H., "Process development and device characteristics of AlGaN/GaN HEMTs for high frequency applications," 2007, PhD Thesis, University of Illinois, Urbana-Champaign, 120 pp.
Kumar et al., "High transconductance enhancement-mode AlGaN/GaN HEMTs on SiC substrate," Electronics Letters, Nov. 27, 2003, 39(24):1758-1760.
Kuraguchi et al. (2007), "Normally-off GaN-MISFET with well-controlled threshold voltage," Phys. Stats. Sol., 204(6):2010-2013.
Lanford et al., "Recessed-gate enhancement-mode GaN HEMT with high threshold voltage," Mar. 31, 2005, Electronics Letters, vol. 41, No. 7, 2 pp., Online No. 20050161.
Lee et al. (2001), "Self-aligned process for emitter- and base-regrowth GaN HBTs and BJTs," Solid-State Electronics, 45:243-247.
Marchand et al. (2001), "Metalorganic chemical vapor deposition of GaN on Si(111): stress control and application to field-effect transistors," Journal of Applied Physics, 89(12):7846-7851.
Mishra et al., "AlGaN/GaN HEMTs—an overview of device operation and applications," Proceedings of the IEEE, 2002, 90(6):1022-1031.
Mishra et al., "Growing N-polar III-nitride structures," U.S. Appl. No. 60/972,467, filed Sep. 14, 2007, 7 pp.
Mishra et al., "N-face high electron mobility transistors with low buffer leakage and low parasitic resistance," U.S. Appl. No. 60/908,914, filed Mar. 29, 2007, 21 pp.
Mishra et al., "Polarization-induced barriers for n-face nitride-based electronics," U.S. Appl. No. 60/940,052, filed May 24, 2007, 29 pp.
Nanjo et al., "Remarkable breakdown voltage enhancement in AlGaN channel high electron mobility transistors," Applied Physics Letters, 2008, 92:263502-1-3.
Napierala, et al., Selective GaN Epitaxy on Si(111) Substrates Using Porous Aluminum Oxide Buffer Layers, J. Electrochem. Soc., 2006, 153(2):G125-127.
Ota and Nozawa (2008), "AlGaN/GaN recessed MIS-Gate HFET with high threshold-voltage normally-off operation for power electronics applications," IEEE Electron Device Letters, 29(7):668-670.
Palacios et al., "Fluorine treatment to shape the electric field in electron devices, passivate dislocations and point defects, and enhance the luminescence efficiency of optical devices," U.S. Appl. No. 60/736,628, filed Nov. 15, 2005, 21 pp.
Palacios et al. (2006), "Nitride-based high electron mobility transistors with a GaN spacer," Applied Physics Letters, 89:073508-1-3.
Palacios et al., "AlGaN/GaN HEMTs with an InGaN-based back-barrier," Device Research Conference Digest, 200, DRC '05 63rd, Jun. 2005, pp. 181-182.
Palacios et al., "AlGaN/GaN high electron mobility transistors with InGaN back-barriers," IEEE Electron Device Letters, 2006, 27(1):13-15.
Pei et al., "Effect of dielectric thickness on power performance of AlGaN/GaN HEMTs," IEEE Electron Device Letters, 2009, 30:4:313-315-.
Planar, Low Switching Loss, Gallium Nitride Devices for Power Conversion Applications, SBIR N121-090 (Navy), 3 pp, 2007.
Rajan et al., "Advanced transistor structures based on N-face GaN," 32M International Symposium on Compound Semiconductors (ISCS), Sep. 18-22, 2005, Europa-Park Rust, Germany, 2 pp, May 7, 2012.
Rajan et al., "Method for Heteroepitaxial growth of high quality N-Face GaN, InN and AlN and their alloys by metal organic chemical vapor deposition," U.S. Appl. No. 60/866,035, filed Nov. 15, 2006, 31 pages.
Reiher et al. (2003), "Efficient stress relief in GaN heteroepitaxy on SiC (111) using low-temperature AlN interlayers," Journal of Crystal Growth, 248:563-567.
Saito et al., "Recess-gate structure approach toward normally off high-voltage AlGaN/GaN HEMT for power electronics applications," Feb. 2006, IEEE Transactions on Electron Device, 53(2):356-362.
Shelton et al., "Selective area growth and characterization of AlGaN/GaN heterojunction bipolar transistors by metalorganic chemical vapor deposition," IEEE Transactions on Electron Devices, 2001, 48(3):490-494.
Shen, L., "Advanced polarization-based design of AlGaN/GaN HEMTs," Jun. 2004, PhD Thesis, University of California, Santa Barbara, 192 pp.
SIPO First Office Action for Application No. 200880120050.6, Aug. 2, 2011, 8 pp.
Sugiura et al., "Enhancement-mode $n$-channel GaN MOSFETs fabricated on $p$-GaN using $HfO_2$ as gate oxide," Aug. 16, 2007, Electronics Letters, vol. 43, No. 17, 2 pp.
Suh et al., "High breakdown enhancement mode GaN-based HEMTs with integrated slant field plate," U.S. Appl. No. 60/822,886, filed Aug. 18, 2006, 16 pp.
Suh et al., "III-nitride devices with recessed gates," U.S. Appl. No. 60/972,481, filed Sep. 14, 2007, 18 pp.
Suh et al. "High-breakdown enhancement-mode AlGaN/GaN HEMTs with integrated slant field-plate," Electron Devices Meeting, 2006. IEDM '06. International (2006), 3 pp.
Tipirneni et al., "Silicon dioxide-encapsulated high-voltage AlGaN/GaN HFETs for power-switching applications," IEEE Electron Device Letters, 28(9):784-786, 2007.
TW Search Report and Action in Application No. 098132132, issued Dec. 6, 2012, 8 pages, 2007.
Vetury et al. (1998), "Direct measurement of gate depletion in high breakdown (405V) Al/GaN/GaN heterostructure field effect transistors," IEDM 98, pp. 55-58.
Wang et al., "Comparison of the effect of gate dielectric layer on 2DEG carrier concentration in strained AlGaN/GaN heterostructure," 2005, Mater. Res. Soc. Symp. Proc., vol. 831, 6 pp.
Wang et al., "Enhancement-mode $Si_3N_4$/AlGaN/GaN MISHFETs," IEEE Electron Device Letters, 2006, 27(10):793-795.
Wu et al., "A 97.8% efficient GaN HEMT boost converter with 300-W output power at 1MHz," Aug. 2008, Electronic Device Letters, IEEE, 29(8):824-826.
Wu, Y., AlGaN/GaN micowave power high-mobility transistors, 1997, PhD Thesis, University of California, Santa Barbara, 134 pp.
Yoshida, S., "AlGan/GaN power FET," Furukawa Review, 21:7-11, 2002.
Zhang, N., "High voltage GaN HEMTs with low on-resistance for switching applications," 2002, PhD Thesis, University of California, Santa Barbara, 166 pp.
Authorized officer Philippe Bécamel, International Preliminary Report on Patentability in PCT/US2010/046193, mailed Mar. 8, 2012, 10 pp.
Authorized officer Yolaine Cussac, International Preliminary Report on Patentability in PCT/US2010/055129, mailed May 18, 2012, 6 pp.
Authorized officer Nora Lindner, International Preliminary Report on Patentability in PCT/US2010/059486, mailed Jun. 21, 2012, 6 pp.
Chinese Office Action in Application No. 200980110230.0, mailed Jan. 24, 2014, 18 pages.

\* cited by examiner

INDUCTIVE LOAD POWER SWITCHING CIRCUITS

This invention relates to power switching circuits, specifically ones for which an inductive load is used.

BACKGROUND

A single-sided switch is a switching configuration where a switching device is used either to connect the load to a node at a lower potential—a "low-side" switch—or to a node at a higher potential—a "high-side" switch. The low-side configuration is shown in FIG. 1a, and the high-side configuration is shown in FIG. 2a, where the node at higher potential is represented by a high voltage (HV) source and the node at lower potential is represented by a ground terminal. In both cases, when the load 10 is an inductive load, a freewheeling diode 11 (sometimes referred to as a flyback diode) is required to provide a path for the freewheeling load current when the switching device is OFF. For example, as seen in FIG. 1b, when the switching device 12 is biased high by applying a gate-source voltage $V_{gs}$ greater than the device threshold voltage $V_{th}$, current 13 flows through the load 10 and through switching device 12, and diode 11 is reverse biased such that no significant current passes through it. When switching device 12 is switched to low by applying a gate-source voltage $V_{gs} < V_{th}$, as shown in FIG. 1c, the current passing through the inductive load 10 cannot terminate abruptly, and so current 13 flows through the load 10 and through diode 11, while no significant current flows through switching device 12. Similar diagrams detailing current flow through the high-side switching configuration when the switch is biased high and when the switch is turned off (switched low) are shown in FIGS. 2b and 2c, respectively.

Ideally, the freewheeling diodes 11 used in the circuits of FIGS. 1 and 2 have low conduction loss in the ON state as well as good switching characteristics to minimize transient currents during switching, therefore Schottky diodes are commonly used. However, for some applications Schottky diodes cannot support large enough reverse-bias voltages, so high-voltage diodes which exhibit higher conduction and switching losses must be used. Switching devices 12, which are usually transistors, may be enhancement mode (normally off, $V_{th} > 0$), also known as E-mode, or depletion mode (normally on, $V_{th} < 0$), also known as D-mode, devices. In power circuits, enhancement mode devices are typically used to prevent accidental turn on, in order to avoid damage to the devices or other circuit components. A key issue with the circuits in FIGS. 1 and 2 is that most high voltage diodes typically exhibit high conduction and switching loss. Further, reverse recovery currents in high-voltage PIN diodes add to the losses of the transistor.

An alternative to the configurations illustrated in FIGS. 1 and 2 is to instead use synchronous rectification, as illustrated in FIGS. 3a-e. FIG. 3a is the same as FIG. 2a, except that a high-voltage metal-oxide-semiconductor (MOS) transistor 61 is included anti-parallel with diode 11. A standard MOS transistor inherently contains an anti-parallel parasitic diode and can therefore be represented as a transistor 62 anti-parallel to a diode 63, as illustrated in FIG. 3a. As seen in FIG. 3b, when switching device 12 is biased high and MOS transistor 61 is biased low, MOS transistor 61 and diode 11 both block a voltage equal to that across the load, so that the entire current 13 flows through the load 10 and through switching device 12. When switching device 12 is switched to low, as shown in FIG. 3c, diode 11 prevents transistor 62 and parasitic diode 63 from turning on by clamping the gate-drain voltage to a value less than $V_{th}$ of the transistor and less than the turn-on voltage of the parasitic diode. Therefore, almost all of the freewheeling current flows through diode 11, while only a small, insignificant portion flows through the transistor channel and parasitic diode. As shown in FIG. 3d, MOS device 61 may then be biased high, which results in an increase in the channel conductivity of transistor 62 and thereby cause the majority of the freewheeling current to flow through the transistor channel. However, some dead time must be provided between turn-off of switching device 12 and turn-on of transistor 62 in order to avoid shoot-through currents from the high-voltage supply (HV) to ground. Therefore, diode 11 will be turned on for some time immediately after switching device 12 is switched from high to low and immediately before switching device 12 is switched back from low to high. While this reduces the conduction losses incurred by diode 11 in the absence of MOS transistor 61, the full switching loss for diode 11 is incurred, regardless of how long the diode remains on.

As shown in FIG. 3e, the circuit in FIGS. 3a-d can in principle operate without diode 11. In this case, parasitic diode 63 performs the same function that diode 11 performed in the circuit of FIGS. 3a-d. However, the parasitic diode 63 typically has much poorer switching characteristics and suffers from higher switching losses than a standard high-voltage diode, resulting in increased power loss, so the circuit of FIGS. 3a-d is usually preferred.

Many power switching circuits contain one or more high-side or low-side switches. One example is the boost-mode power-factor correction circuit shown in FIG. 4a, which contains a low-side switch. This circuit is used at the input end in AC-to-DC voltage conversion circuits. The configuration for the low-side switch in this circuit is slightly modified from that shown in FIG. 1a, since in FIG. 1a the freewheeling diode 11 is connected anti-parallel to the inductive load 10, whereas in this circuit the freewheeling diode 11 is between the inductive load 30 and the output capacitor 35. However, the fundamental operating principles of the two circuits are the same. As seen in FIG. 4b, when switching device 12 is biased high, current 13 passes through the load 30 and through the switching device 12. The voltage at the cathode end of the freewheeling diode 11 is kept sufficiently high by the output capacitor 35 so that the freewheeling diode 11 is reverse-biased, and thereby does not have any significant current passing through it. As seen in FIG. 4c, when switching device 12 is switched low, the inductor forces the voltage at the anode of the freewheeling diode 11 to be sufficiently high such that the freewheeling diode 11 is forward biased, and the current 13 then flows through the inductive load 30, the freewheeling diode 11, and the output capacitor 35. Because no significant current can flow in the reverse direction in a diode, diode 11 prevents discharge of the output capacitor 35 through switching device 12 during times where the load current is zero or negative, as can occur if the energy stored in the inductor 30 is completely transferred out before the commencement of the next switching cycle.

SUMMARY

In one aspect, a switch is described that includes a first switching device in series with an assembly comprising a load and a second switching device, the first switching device including a first channel, the second switching device including a second channel, wherein in a first mode of operation the second switching device is capable of blocking a voltage applied across the second switching device in a first direction, in a second mode of operation a substantial current flows through the second channel of the second switching device when a voltage is applied across the second switching device in a second direction and a gate of the second switching device is biased below a threshold voltage of the second switching device, and in a third mode of operation a substantial current flows through the second channel of the second switching device when a voltage is applied across the second switching device in the second direction and the gate of the second switching device is biased above the threshold voltage of the second switching device.

The switch or the assembly can be free of any diodes.

In another aspect, a method of operating a switch is described. At a first time, a gate of a first switching device of a switch is biased higher than a threshold voltage of the first switching device and a gate of a second switching device is biased lower than a threshold voltage of the second switching device, allowing current to flow from a high voltage side of the switch to a low voltage or ground side of the switch through the load. At a second time immediately following the first time, a bias on the gate of the first switching device is changed to be lower than the threshold voltage of the first switching device, causing the second switching device to operate in diode mode and blocking current from flowing to ground. At a third time immediately following the second time, a bias on the gate of the second switching device is changed to be higher than the threshold voltage of the second switching device, wherein changing the bias at the third time reduces conduction loss in comparison to switch operation between the second time and the third time.

In another aspect, a boost-mode power-factor correction circuit is described. The circuit includes a first switching device comprising a first channel, an inductive load, a capacitor, and a second switching device comprising a second channel, wherein the first switching device is connected to a node between the inductive load and a floating gate drive circuit, the second switching device is configured to be connected to the floating gate drive circuit, and the second switching device is between the inductive load and the capacitor.

In yet another aspect, a method of operating the boost-mode power-factor correction circuit is described. The method includes causing a load current through the inductive load to be continuous; at a first time, biasing a gate of the first switching device higher than a threshold voltage of the first switching device and biasing a gate of the second switching device lower than a threshold voltage of the second switching device, allowing current to flow through the first switching device; at a second time immediately following the first time, changing a bias on the gate of the first switching device to be lower than the threshold voltage of the first switching device, causing the first switching device to operate in blocking mode and the second switching device to operate in diode mode, allowing current to flow through the second switching device; at a third time immediately following the second time, changing a bias on the gate of the second switching device to be higher than the threshold voltage of the second switching device, wherein changing the bias at the third time reduces conduction loss in comparison to switch operation between the second time and the third time.

In another aspect, a method of operating the boost-mode power-factor correction circuit is described. The method includes causing a load current through the inductive load to be discontinuous, sensing the load current, and when the load current approaches zero, changing a bias on a gate of the second switching device from a voltage higher than a threshold voltage of the second switching device to a voltage lower than the threshold voltage of the second switching.

In yet another aspect a method of operating the boost-mode power-factor correction circuit is described. The method includes sensing a load current passing through the inductive load, causing the load current to approach zero and immediately increase after approaching zero, and when the load current approaches zero, switching the second switching device from on to off and switching the first switching device from off to on.

In some embodiments, the following features are present. The first mode of operation can comprise biasing the gate of the first switching device above a threshold voltage of the first switching device. The second mode of operation can comprise biasing the gate of the first switching device below a threshold voltage of the first switching device. The first switching device can have a first terminal and a second terminal on opposite sides of the gate, and the first terminal can be adjacent to the assembly and at a higher voltage than the second terminal of the first switching device during operation. The first switching device can have a first terminal and a second terminal on opposite sides of the gate, and the first terminal can be adjacent to the assembly and at a lower voltage than the second terminal of the first switching device during operation. A first node can be between the assembly and the first switching device, a second node can be at a high voltage side of the switch, and the second switching device can be capable of blocking a voltage when voltage at the first node is lower than voltage at the second node. A first node can be between the assembly and the first switching device, a second node can be at a low voltage or ground side of the switch, and the second switching device can be capable of blocking a voltage when voltage at the first node is higher than voltage at the second node. The second switching device can be capable of blocking a same voltage as the first switching device is capable of blocking. The second switching device can be capable of blocking voltage in two directions. When the gate of the first switching device is biased lower than a threshold voltage of the first switching device, the second switching device can be capable of conducting current. When the gate of the first switching device is biased lower than the threshold voltage of the first switching device, substantially all current can flow through a single primary channel of the second switching device. When the gate of the second switching device is biased higher than the threshold voltage of the second switching device, the voltage drop across the second switching device can be reduced as compared to when the gate of the second switching device is biased lower than the threshold voltage of the second switching device. The second switching device can have a positive threshold voltage. The first switching device can have a positive threshold voltage. The second switching device can be a HEMT. The second switching device can be a III-Nitride HEMT. The first switching device can be a HEMT. The first switching device can be a III-Nitride HEMT. The second switching device can be structurally the same as the first switching device. A voltage drop across the second switching device can be smaller in the third mode of operation as compared to in the second mode of operation. The load can be an inductive load. The first switching device or the second switching device can comprise a high-voltage depletion mode device and a low-voltage enhancement mode device, the second channel can be a channel of the high-voltage depletion mode device, and the threshold voltage of the second switching device can be a threshold voltage of the low-voltage enhancement mode device. The low-voltage enhancement mode device can at least block a voltage equal to an absolute value of a threshold voltage of the high-voltage depletion mode device. The high-voltage depletion mode device can be a III-Nitride HEMT. The low-voltage enhancement mode device can be a III-Nitride HEMT. The low-voltage enhancement mode device can be a Si MOS device. The device can include a diode connected antiparallel to the low-voltage enhancement mode device. The first switching device can comprise a high-voltage depletion mode device and a low-voltage enhancement mode device, the first channel can be a channel of the high-voltage depletion mode device, and a threshold voltage of the first switching device can be a threshold voltage of the low-voltage enhancement mode device.

Boost-mode power-factor correction circuits can include one or more of the following features. The first switching device can be a III-N HEMT. The second switching device can be a III-N HEMT.

Operating a boost-mode power-factor correction circuit can include causing a load current through the inductive load to be discontinuous, sensing the load current, and when the load current approaches zero, changing a bias on a gate of the second switching device from a voltage higher than a threshold voltage of the second switching device to a voltage lower than the threshold voltage of the second switching device. A load current passing through the inductive load, causing the load current to approach zero and immediately increase after approaching zero is sensed. When the load current approaches zero, the second switching device is switched from on to off and the first switching device is switched from off to on.

Methods described herein may include one or more of the following features or steps. Changing the bias at the third time can reduce conduction loss in comparison to switch operation at the second time.

DETAILED DESCRIPTION

Figure 1:
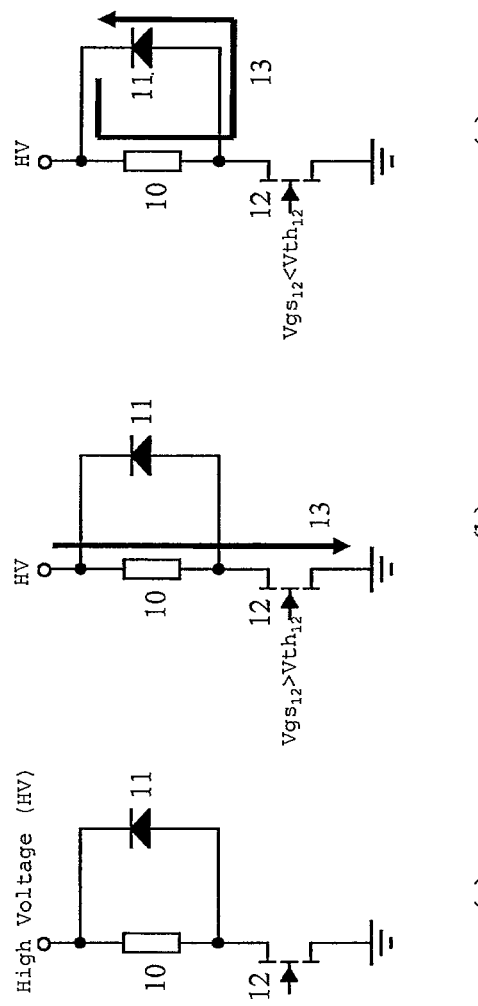
FIGS. 1a-c show schematics of a low-side switch, and current paths for various bias conditions.
Figure 2:
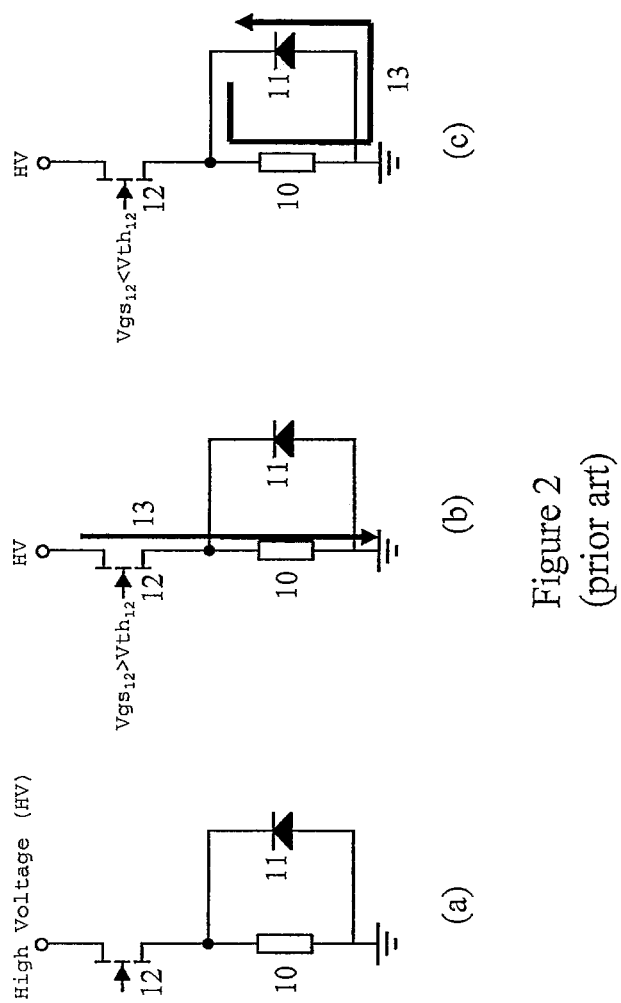
FIGS. 2a-c show schematics of a high-side switch, and current paths for various bias conditions.
Figure 3:
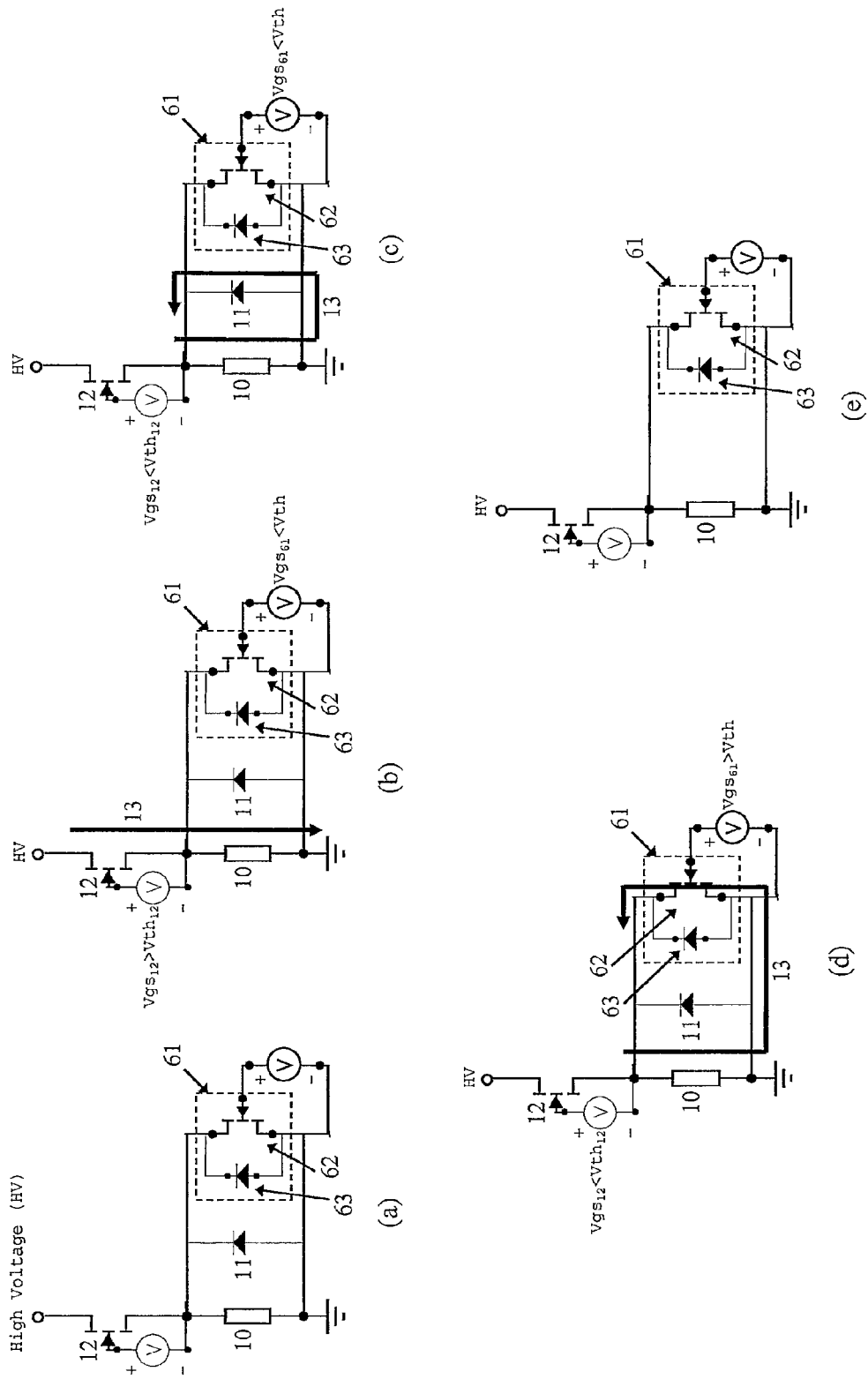
FIGS. 3a-e show schematics of high-side switches with a MOSFET connected across the inductive load, and current paths for various bias conditions.

Low-side and high-side switches and the circuits which they comprise, wherein the freewheeling diode shown in FIGS. 1-3 is replaced by a switching device, such as a transistor, are described below. Embodiments are shown in FIGS. 5a and 6a, wherein FIG. 5a comprises a low-side switch, and FIG. 6a comprises a high-side switch. In FIGS. 5a and 6a, the freewheeling diode used in the circuits of FIGS. 1 and 2 has been replaced by switching device 41. In some embodiments, this device may be the same as the switching device 42 used to modulate the current path. FIGS. 5b and 6b illustrate the current path when switching device 42 is biased ON (high) and switching device 41 is biased OFF (low). FIGS. 5c and 6c illustrate the current path when switching device 42 is switched OFF. Switching device 41 can be an enhancement mode device, where the threshold voltage $V_{th}>0$, or a depletion mode device, where the threshold voltage $V_{th}<0$. In high power applications, it is desirable to use enhancement mode devices with threshold voltages as large as possible, such as $V_{th}>2V$ or $V_{th}>3V$, a high internal barrier from source to drain at 0 bias (such as 0.5-2 eV), a high ON-to-OFF current ratio (such as $>10^5$), along with high breakdown voltage (600/1200 Volts) and low on resistance ($<5$ or $<10$ mohm-cm$^2$ for 600/1200 V respectively).

Additionally, switching device 41 must have the following characteristics. It must be able to block significant voltage when the voltage at terminal 45/55 is lower than the voltage at terminal 46/56. This condition occurs when switching device 42 is biased high, as shown in FIGS. 5b and 6b. As used herein, "blocking a voltage" refers to the ability of a transistor to prevent a current that is greater than 0.0001 times the operating current during regular conduction from flowing through the transistor when a voltage is applied across the transistor. In other words, while a transistor is blocking a voltage which is applied across it, the total current passing through the transistor will not be greater than 0.0001 times the operating current during regular conduction. As used herein, "substantial current" includes any current which is at least ten percent of the operating current during regular conduction. The maximum voltage that switching device 41 must be able to block depends on the particular circuit application, but in general will be the same or very close to the maximum blocking voltage specified for switching device 42. In some embodiments, switching device 41 is able to block voltage in both directions. When switching device 42 is switched OFF, switching device 41 must be capable of conducting current 13 in the direction shown in FIGS. 5c and 6c. Furthermore, when the circuit is biased such as shown in FIG. 5c or 6c, all substantial current through switching device 41 flows through a single, primary channel of the device, wherein the conductivity of this channel may be modulated by the gate electrode. This is different from the circuits in FIGS. 3a-3e, for which applying a voltage signal to the gate electrode of device 61 causes the current to shift from one channel (that of diode 11 or 63) to that of the transistor 62. The maximum current that switching device 41 must be able to conduct in this direction depends on the particular circuit application, but in general will be the same or very close to the maximum current specified for switching device 42. In some embodiments, the switching devices are able to conduct current in both directions.

Figure 5:
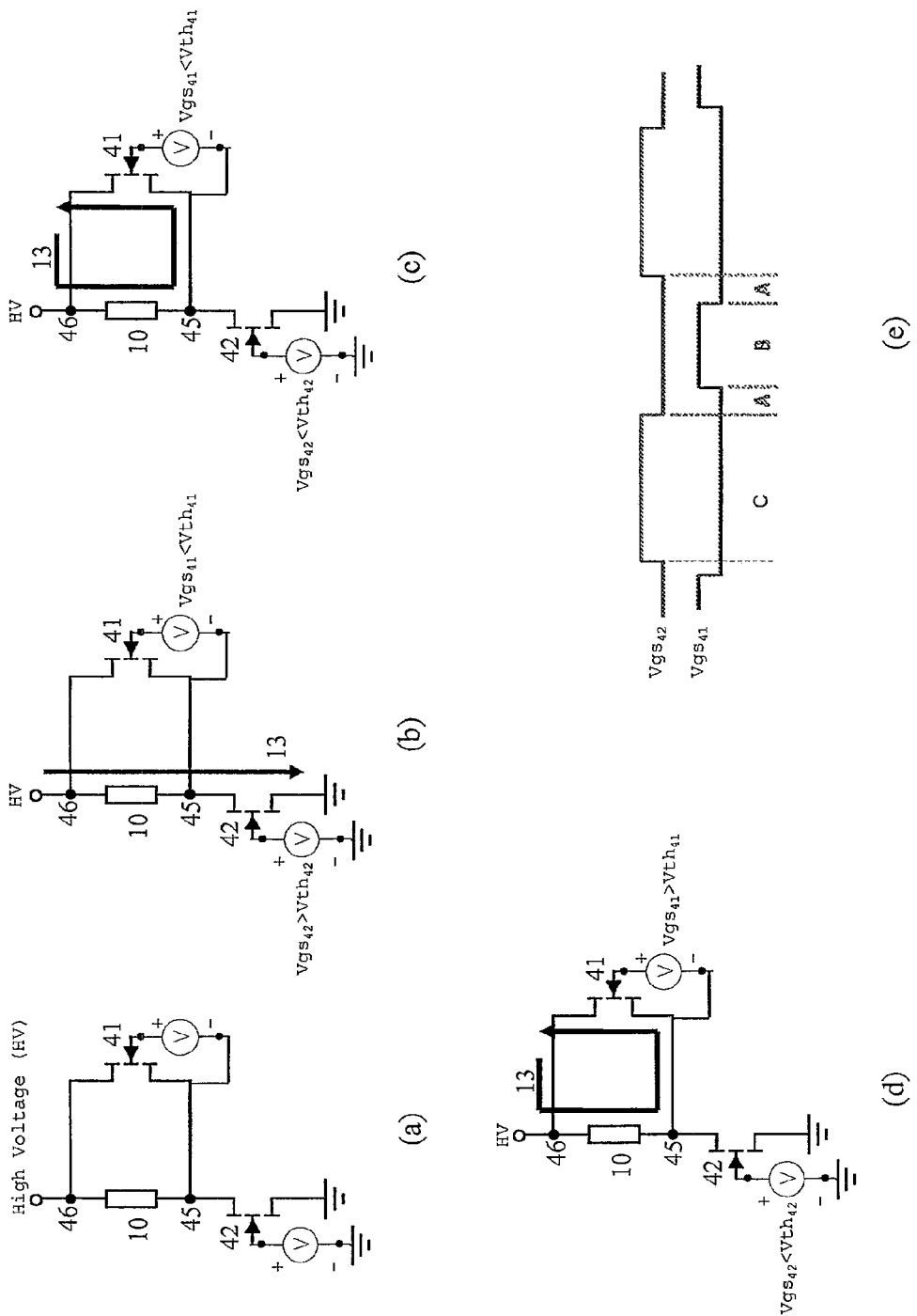
FIGS. 5a-d show schematics of a low-side switch, along with current paths for various bias conditions.
FIG. 5e shows a biasing scheme for the switching devices in the circuits of FIGS. 5a-d.

The detailed operation of the circuit in FIG. 5 is as follows. When switching device 42 is biased ON, such as by setting the gate-source voltage $V_{GS42}$ greater than the device threshold voltage $V_{th42}$, and switching device 41 is biased OFF, such as by setting $V_{GS41}<V_{th41}$, current 13 flows through inductive load 10 and switching device 42, as seen in FIG. 5b. Here, switching device 41 is said to be in "blocking mode", as it is supporting a voltage across it while at the same time blocking current from flowing through it, i.e., device 41 is blocking voltage. As shown in FIG. 5c, when switching device 42 is switched OFF, the current through the inductive load 10 cannot change abruptly, so the voltage at terminal 45 is forced sufficiently high to allow the freewheeling current 13 to be carried through switching device 41. Note that in this mode of operation, current is able to flow through switching device 41 even if $V_{GS41}$ is not changed. This mode of operation for switching device 41 is known as "diode mode operation". The circuit of FIG. 5 may be preferable to that of FIG. 1 because transistors suitable for use in this application typically have lower conduction and switching losses than diode 11.

Depending on the current level and the threshold voltage of switching device 41, the power dissipation through this device could be unacceptably high when operating in the diode mode. In this case, a lower power mode of operation may be achieved by applying a voltage $V_{GS41} > V_{th41}$ to the gate of switching device 41, as shown in FIG. 5d. To prevent shoot-through currents from the high-voltage supply (HV) to ground, gate signals of the form shown in FIG. 5e are applied. The time during which switching device 42 is ON and switching device 41 is OFF is labeled "C" in FIG. 5e. This corresponds to the mode of operation shown in FIG. 5b. When switching device 42 is switched OFF, during the time switching device 41 conducts the freewheeling current, the gate of switching device 41 is driven high, allowing the drain-source voltage of switching device 41 to be simply the on-state resistance ($R_{ds-on}$) times the load current. To avoid shoot-through currents from the high-voltage supply (HV) to ground, some dead time must be provided between turn-off of switching device 42 and turn-on of switching device 41. These are the times labeled "A" in FIG. 5e. During these dead times, switching device 41 operates in the diode mode described above. Since this is a short time in comparison with the entire switching cycle, the relative amount of total power dissipation is low. Time "B" provides the dominant loss factor for switching device 41, and this corresponds to the low-power mode when switching device 41 is fully enhanced. The mode of operation illustrated in FIG. 5d allows for a further reduction in conduction loss, although switching losses remain unaffected.

In the circuit of FIG. 5, when switching device 42 is switched OFF, all substantial current flows through the primary channel of switching device 41 when the gate of switching device 41 remains low (FIG. 5c) as well as when it is driven high (FIG. 5d). This may be preferable to the operation of the circuit in FIG. 3, for which substantial current initially flows through a diode while transistor 61 remains low and only flows through the primary transistor channel once the gate of transistor 61 is driven high. Diode 11 and parasitic diode 63 in FIG. 3 typically exhibit higher switching losses than transistors 41 suitable for use in the circuit of FIG. 5. Additionally, switching devices 41 and 42 in FIG. 5 can be identical or similar devices, which simplifies the fabrication of this circuit.

Figure 6:
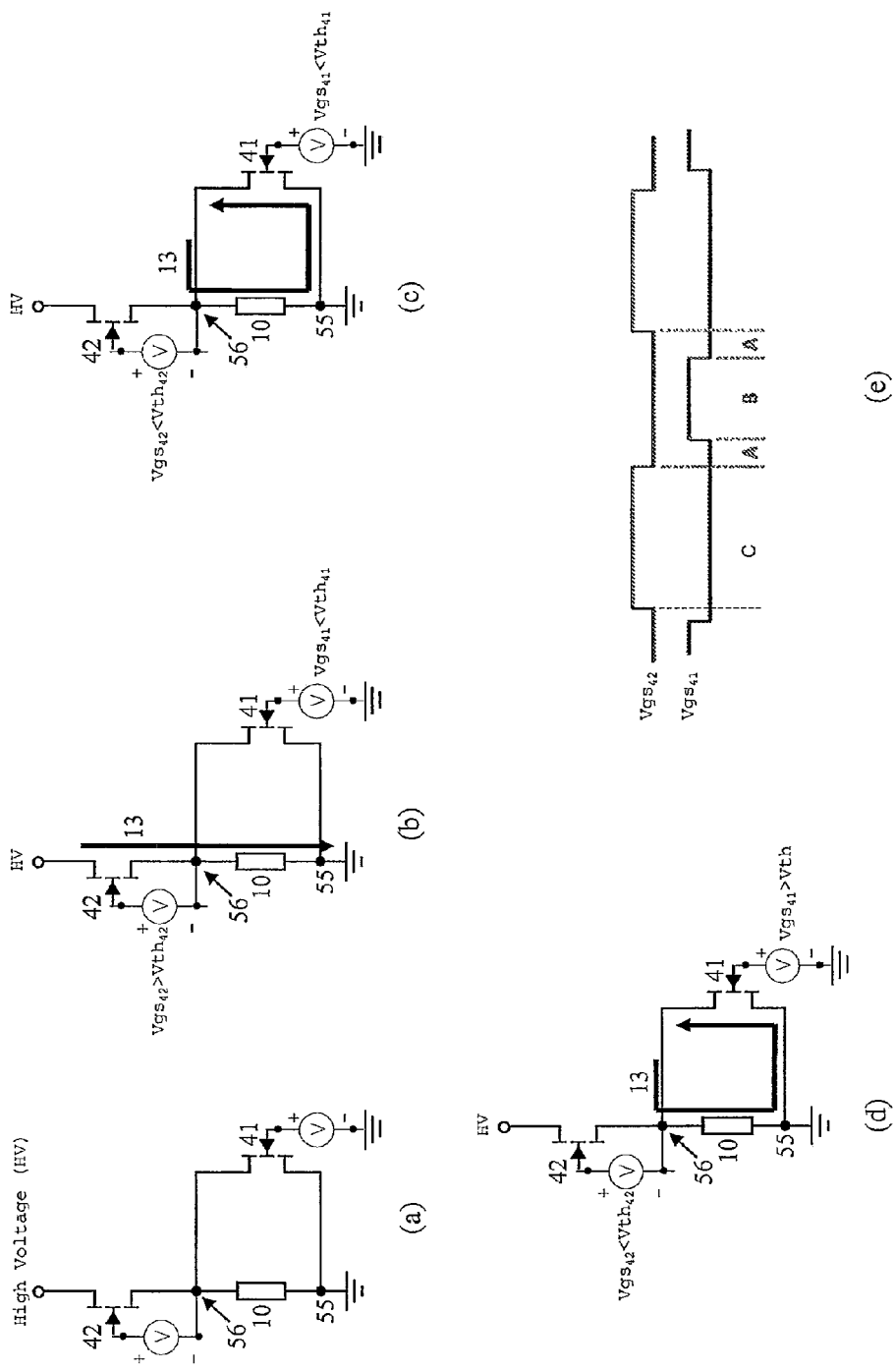
FIGS. 6a-d show schematics of a high-side switch, along with current paths for various bias conditions.
FIG. 6e shows a biasing scheme for the switching devices in the circuits of FIGS. 6a-d.

The detailed operation of the circuit in FIG. 6 is similar to that of FIG. 5. When switching device 42 is biased ON, such as by setting $V_{GS42} > V_{th42}$, and switching device 41 is biased OFF, such as by setting $V_{GS41} < V_{th41}$, current 13 flows through inductive load 10 and switching device 42, as seen in FIG. 6b. As shown in FIG. 6c, when switching device 42 is switched OFF, the current through the inductive load 10 cannot change abruptly, so the voltage at terminal 56 is forced sufficiently negative to allow the freewheeling current 13 to be carried through switching device 41, and switching device 41 now operates in diode mode. Again, in this mode of operation, current is able to flow through switching device 41 even if $V_{GS41}$ is not changed. As with the circuit of FIG. 5, power dissipation during diode mode operation of switching device 41 may be reduced by applying a voltage $V_{GS41} > V_{th41}$ to the gate of switching device 41, as shown in FIG. 6d. Again, some dead time must be provided between turn-off of switching device 42 and turn-on of switching device 41 in order to avoid shoot-through currents from the high-voltage supply (HV) to ground, and so the bias scheme shown in FIG. 6e is used.

Examples of devices that meet the criteria specified above for switching device 41 are metal-semiconductor field effect transistors (MESFETs) of any material system, junction field effect transistors (JFETs) of any material system, high electron mobility transistors (HEMTs or HFETs) of any material system, including vertical devices such as current aperture vertical electron transistors (CAVETs), and bidirectional switches comprised of the devices listed above, such as those described U.S. application Ser. No. 12/209,581, filed Sep. 12, 2008, which is hereby incorporated by reference throughout. Common material systems for HEMTs and MESFETs include $Ga_xAl_yIn_{1-x-y}N_mAs_nP_{1-m-n}$ or III-V materials, such as III-N materials, III-As materials, and III-P materials. Common materials for JFETs include III-V materials, SiC, and Si.

Preferably, switching device 41 is an enhancement mode device to prevent accidental turn on, in order to avoid damage to the device or other circuit components. III-Nitride (III-N) devices, such as III-Nitride HFETs, are especially desirable due to the large blocking voltages that can be achieved with these devices. The device preferably also exhibits a high access region conductivity (such as sheet resistance <750 ohms/square) along with high breakdown voltage (600/1200 Volts) and low on resistance (<5 or <10 mohm-cm$^2$ for 600/1200 V respectively). The device can also include any of the following: a surface passivation layer, such as SiN, a field plate, such as a slant field plate, and an insulator underneath the gate. In other embodiments, switching device 41 is a SiC JFET.

Figure 7:
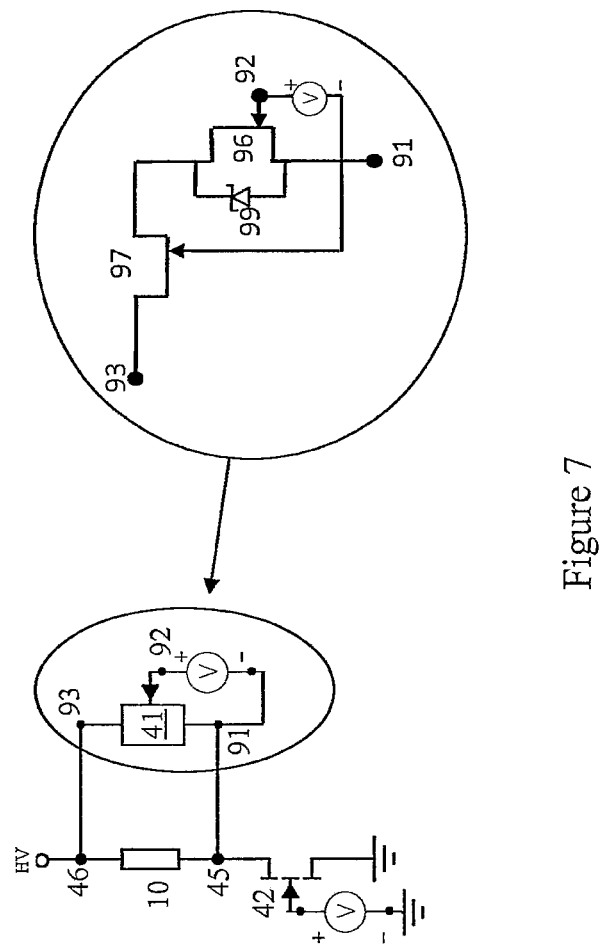
FIG. 7 shows a schematic of a low-side switch.

A variation on switching device 41, which can be used with any of the embodiments described herein, embodiment is shown in FIG. 7. In this embodiment, switching device 41 includes a high-voltage depletion mode (D-mode) device 97 connected to a low-voltage enhancement mode (E-mode) device 96 as shown. This configuration for switching device 41 operates similarly to the case when a high-voltage E-mode device is used for switching device 41. When the voltage at node 46 is higher than that at node 45 and the gate of E-mode device 96 is biased at 0V or below the threshold voltage of E-mode device 96, D-mode device 97 blocks the voltage across the switch. This configuration can be advantageous because high-voltage E-mode devices are typically difficult to fabricate. The D-mode device 97 is capable of blocking the maximum voltage drop across the switch, which for high-voltage applications can be 600V or 1200V or other suitable blocking voltage required by the application. Typical D-mode device threshold voltages for high-voltage devices are about −5 to −10V (D-mode=negative $V_{th}$). The E-mode device 96 can block at least $|V_{th}|$, where $|V_{th}|$ is the magnitude (absolute value) of the threshold voltage of the D-mode device. In some embodiments the E-mode device can block about $2*|V_{th}|$. In some embodiments, the D-mode device can block about 1200V and has a threshold voltage of about −5V, and the E-mode device blocks at least about 5V, such as at least about 10V. D-mode device 97 can be a high-voltage III-N HEMT device, and E-mode device 96 can be a Si MOS device or a III-N HEMT device. When a Si MOS device is used for device 96, diode 99, which is a low-loss diode such as Schottky diode, can optionally be connected antiparallel to device 96, as shown, in order to reduce switching losses by preventing turn-on of the parasitic reverse diode inherent in Si MOSFETs. A similar configuration to the one shown for switching device 41 in FIG. 7 can also be used for switching device 42, and the configuration may also be used for switching devices 41 and 42 in the high-side switch of FIG. 6. More details of the operation of this configuration can be found in U.S. application Ser. No. 12/209,581.

Figure 4:
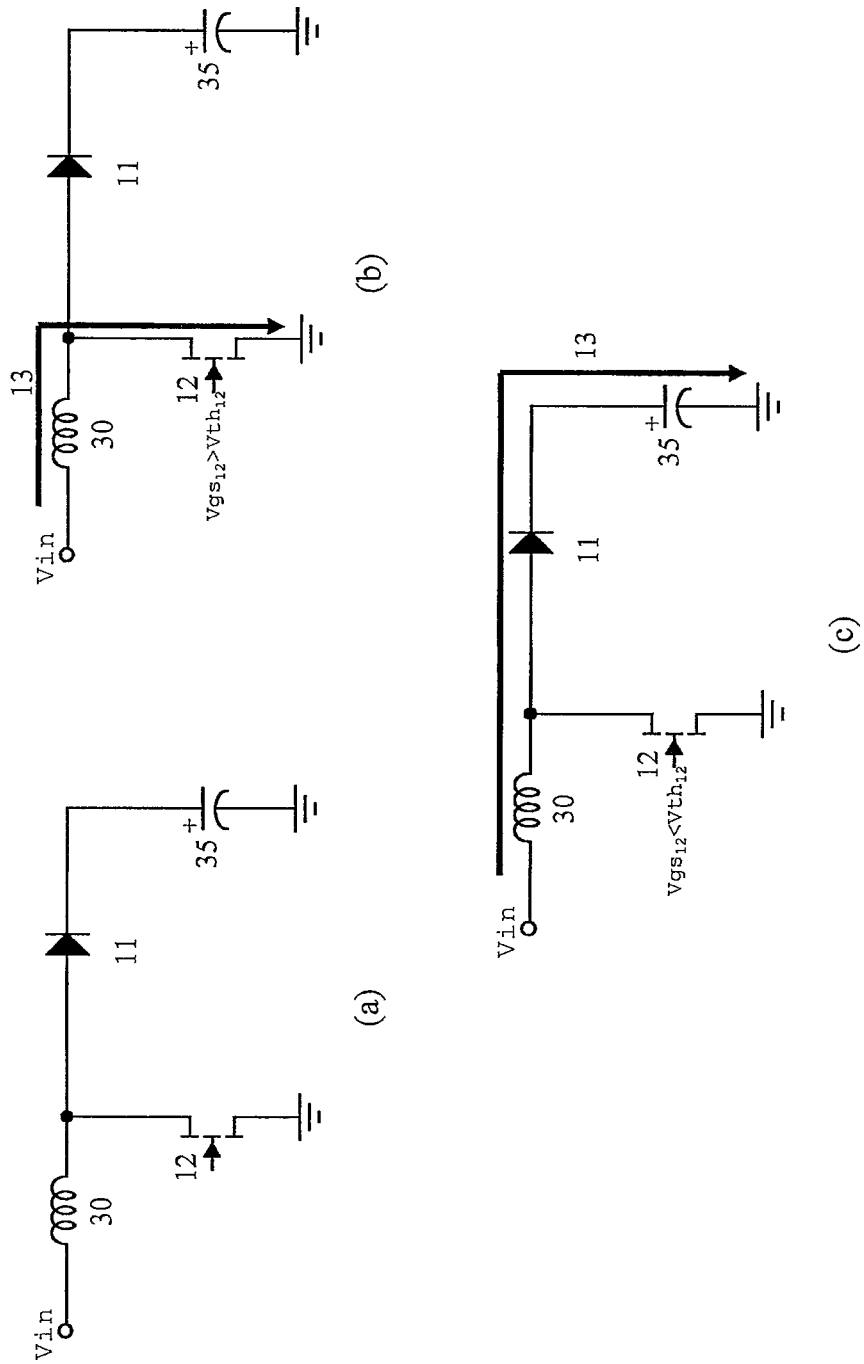
FIGS. 4a-c show schematics of a boost-mode power-factor correction circuit and current paths for various bias conditions.
Figure 8:
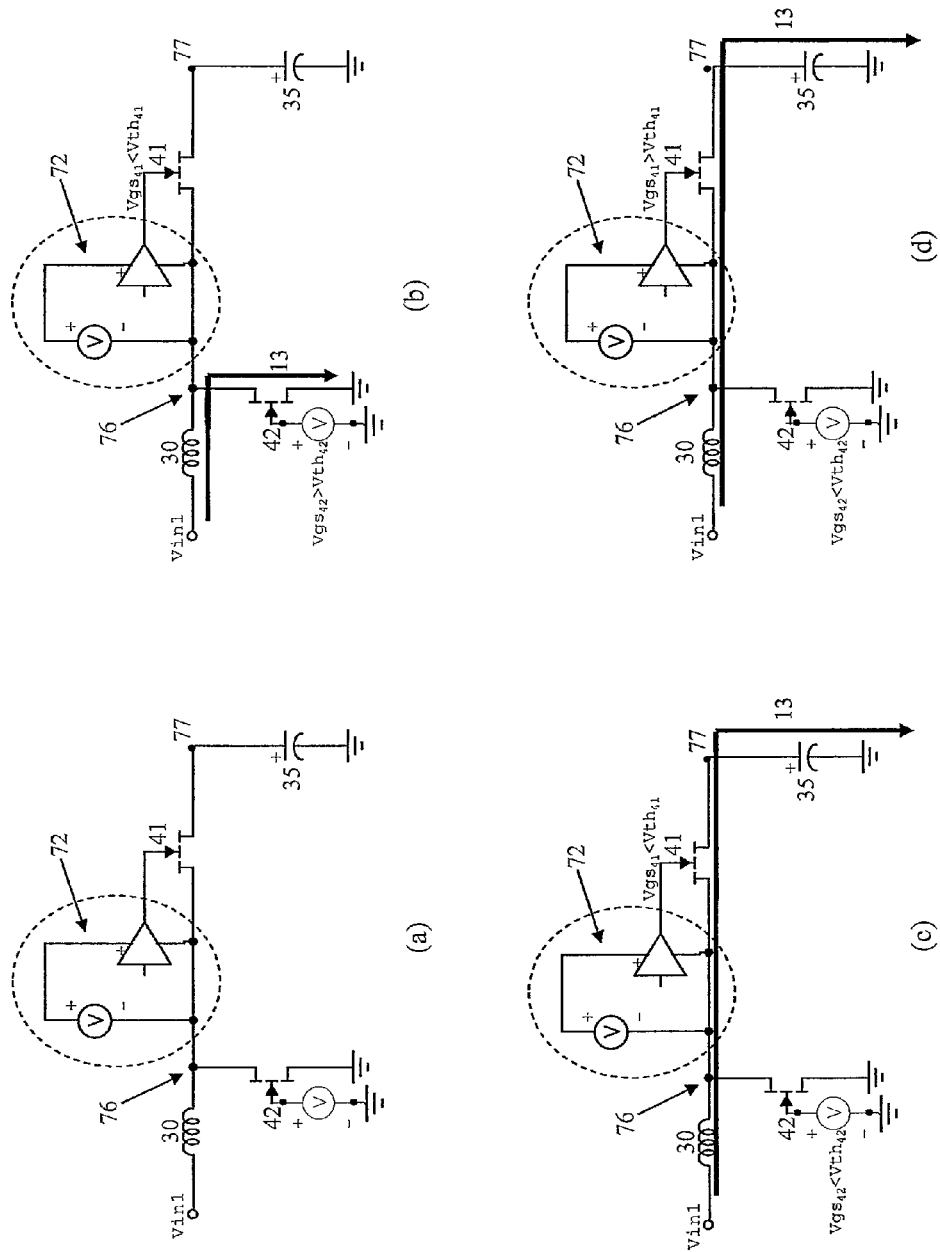
FIGS. 8a-d show schematics of a boost-mode power-factor correction circuit, along with current paths for various bias conditions.
FIG. 8e shows a biasing scheme for the switching devices in the circuits of FIGS. 8a-d.
Figure 8:
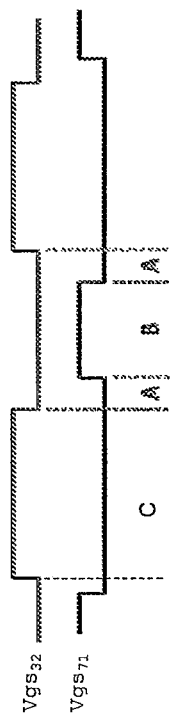

A boost-mode power-factor correction circuit is shown in FIG. 8a. This circuit is similar to that shown in FIG. 4a, except that diode 11 has been replaced by a switching device 41 connected to a floating gate-drive circuit 72. Switching device 41 must meet the same specifications as switching device 41 in FIGS. 5 and 6. The details of operation of this circuit are as follows. When switching device 42 is biased ON and switching device 41 is biased OFF, as seen in FIG. 8b, current 13 passes through the load 30 and through the switching device 42. The voltage at node 77 is kept sufficiently high by the output capacitor 35 so that switching device 41 is in blocking mode, and thereby does not have any substantial current passing through it. As seen in FIG. 8c, when switching device 42 is switched OFF, the inductor forces the voltage at node 76 to be sufficiently high such that switching device 41 switches to diode mode, and the current 13 then flows through the inductive load 30, switching device 41, and the output capacitor 35.

Figure 9:
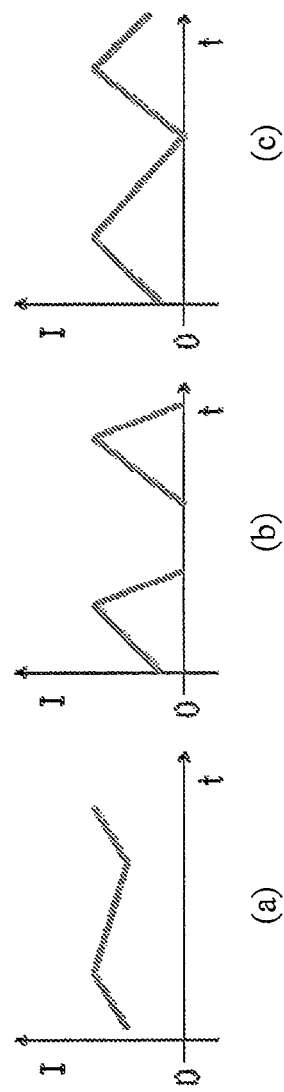
FIGS. 9a-c show the input current as a function of time for various operating conditions for the circuit in FIG. 8.

As with the circuits in FIGS. 5 and 6, conduction losses in this circuit can be reduced by applying a voltage $V_{GS41} > V_{th41}$ to the gate of switching device 41, as shown in FIG. 8d. However, for this circuit to operate properly, the timing of the signals applied by gate-drive circuit 72 to the gate of switching device 41 must be properly controlled. There are three cases which need to be considered independently. The first, illustrated in FIG. 9a, is the case where the load current is continuous (continuous mode). The second, illustrated is FIG. 9b, is the case where the load current is discontinuous (discontinuous mode), such that no current flows during some portion of the duty cycle. For this second case, it is also possible that the load current is negative (flows in the opposite direction through the load) during some portion of the duty cycle. This may occur if there are any inductive or capacitive components leading into the input of this circuit. The third, illustrated in FIG. 9c, is the case where the load current approaches zero but then immediately increases again. This mode is known as the "critical mode".

If the load current is continuous, then the timing of the gate signals to switching devices 42 and 41 is similar to that of the circuits in FIGS. 5 and 6. To allow the load current to flow through switching device 42, switching device 42 is switched ON and switching device 41 is switched OFF, as in FIG. 8b. When switching device 42 is switched OFF, the inductor forces the load current through switching device 41 as shown in FIG. 8c, and switching device 41 is in diode mode. While current flows through switching device 41, conduction losses can be reduced by applying a voltage $V_{GS41} > V_{th41}$ to the gate of switching device 41, as shown in FIG. 8d. Some dead time must be provided between turn-off of switching device 42 and turn-on of switching device 41 in order to prevent the capacitor 35 from discharging through switching devices 42 and 41, and so the bias scheme shown in FIG. 8e is used.

The current in the inductor can become discontinuous or negative if the energy stored in it is completely transferred, either to the output capacitor or through switching device 42, before the commencement of the next switching cycle. In circuits where the switching device 41, or flyback transistor, is connected in parallel to the load, such as those in FIGS. 5 and 6, there is no harm in leaving the flyback transistor enhanced even after the load current has dropped to zero. However, in the power factor correction circuit of FIG. 8, where the flyback transistor is between inductor 30 and capacitor 35, incorrect operation would result from leaving switching device 41 enhanced after the load current drops to zero, because the current would reverse sign and start discharging the output capacitor. In such a system, the load current must be sensed, either directly or indirectly, and if switching device 41 is on, it must be turned off when the current approaches zero. For example, switching device 41 can be turned off once the current has dropped to 0.1%, 1%, 3%, or 5% of the peak current.

The third case, the critical mode, is essentially the same as the discontinuous mode, with the difference that the switching device 42 turns back on as soon as the load current approaches zero. This implies that the switching frequency is not fixed, but adjustable, as in a hysteretic controller. The control circuit is therefore very different from the discontinuous case, but the requirement regarding the switching sequence of the switching devices 42 and 41 is the same. The current must be sensed to know when it has approached zero, and switching device 41 must be turned off when the current approaches zero.

What is claimed is:

1. An apparatus, comprising:
an inductive component coupled to a switching device, the switching device comprising a depletion mode device and an enhancement mode device, the enhancement mode device including a gate, and the depletion mode device including a channel; wherein
the switching device is configured such that in a first mode of operation current flows through the channel of the depletion mode device in a first direction when the gate of the enhancement mode device is biased below a threshold voltage of the enhancement mode device, and in a second mode of operation current flows through the channel of the depletion mode device in the first direction when the gate of the enhancement mode device is biased above the threshold voltage of the enhancement mode device.

2. The apparatus of claim 1, wherein the switching device is configured such that in a third mode of operation the depletion mode device blocks voltage applied in a second direction across the switching device.

3. The apparatus of claim 2, wherein in the third mode of operation the enhancement mode device blocks a voltage at least equal to an absolute value of a threshold voltage of the depletion mode device.

4. The apparatus of claim 2, wherein in the third mode of operation the gate of the enhancement mode device is biased below the threshold voltage of the enhancement mode device.

5. The apparatus of claim 1, wherein the depletion mode device is a high-voltage device, the enhancement mode device is a low-voltage device, and the switching device is configured to operate as a high-voltage enhancement mode device.

6. The apparatus of claim 1, wherein the depletion mode device comprises a III-N HEMT.

7. The apparatus of claim 6, wherein the enhancement mode device comprises a Si MOS device or a III-N HEMT.

8. The apparatus of claim 6, wherein the enhancement mode device comprises a Si MOS device, the Si MOS device includes an inherent parasitic diode, and the switching device further comprises a Schottky diode connected antiparallel to the Si MOS device.

9. The apparatus of claim 1, wherein the apparatus is part of a power-factor correction circuit.

10. The apparatus of claim 1, wherein the switching device is a first switching device, and the apparatus further comprises a second switching device.

11. A method of operating an apparatus, the apparatus comprising an inductive component coupled to a first switching device and a second switching device, the second switching device comprising a depletion mode device and an enhancement mode device, the enhancement mode device including a gate, the depletion mode device including a channel, the method comprising:
flowing a current through the inductive component;
at a first time, biasing a gate of the first switching device at a voltage lower than a threshold voltage of the first switching device and biasing the gate of the enhancement mode device at a voltage lower than a threshold voltage of the enhancement mode device, causing the first switching device to operate in blocking mode and the second switching device to operate in diode mode, wherein the current flows through the channel of the depletion mode device in a first direction; and
at a second time following the first time, changing the bias on the gate of the enhancement mode device to be higher than the threshold voltage of the enhancement mode device, wherein the current continues to flow through the channel of the depletion mode device in the first direction.

12. The method of claim 11, wherein the depletion mode device is a high-voltage device, the enhancement mode device is a low-voltage device, and the second switching device is configured to operate as a high-voltage enhancement mode device.

13. The method of claim 12, wherein the depletion mode device comprises a III-N HEMT, and the enhancement mode device comprises a Si MOS device or a III-N HEMT.

14. The method of claim 12, wherein the depletion mode device comprises a III-N HEMT, the enhancement mode device comprises a Si MOS device, the Si MOS device includes an inherent parasitic diode, and the switching device further comprises a Schottky diode connected antiparallel to the Si MOS device.

15. The method of claim 11, wherein changing the bias at the second time reduces conduction loss in comparison to operation between the first time and the second time.

16. The method of claim 11, further comprising at a third time prior to the first time, biasing the gate of the first switching device at a voltage higher than the threshold voltage of the first switching device and biasing the gate of the enhancement mode device at a voltage lower than the threshold voltage of the enhancement mode device, causing the second switching device to operate in blocking mode and allowing the current to flow through the first switching device.

17. The method of claim 16, wherein while the second switching device operates in blocking mode, the enhancement mode device blocks a voltage at least equal to an absolute value of a threshold voltage of the depletion mode device.

18. The method of claim 11, wherein the apparatus is part of a power-factor correction circuit.

19. A circuit comprising a switching device, the switching device including a high-voltage depletion mode device and a low-voltage enhancement mode device, the enhancement mode device including a gate, the depletion mode device including a channel; wherein
the switching device is configured such that in a first mode of operation current flows through the channel of the depletion mode device in a first direction when the gate of the enhancement mode device is biased below a threshold voltage of the enhancement mode device, and in a second mode of operation current flows through the channel of the depletion mode device in the first direction when the gate of the enhancement mode device is biased above the threshold voltage of the enhancement mode device.

20. The circuit of claim 19, wherein the switching device is configured such that in a third mode of operation the depletion mode device blocks voltage applied in a second direction across the switching device.

21. The circuit of claim 20, wherein in the third mode of operation the enhancement mode device blocks a voltage at least equal to an absolute value of a threshold voltage of the depletion mode device.

22. The circuit of claim 20, wherein in the third mode of operation the gate of the enhancement mode device is biased below the threshold voltage of the enhancement mode device.

23. The circuit of claim 19, wherein the switching device is configured to operate as a high-voltage enhancement mode device.

24. The circuit of claim 19, wherein the depletion mode device comprises a III-N HEMT.

25. The circuit of claim 24, wherein the enhancement mode device comprises a Si MOS device or a III-N HEMT.

26. The circuit of claim 19, wherein the circuit is a power-factor correction circuit.

27. A method of operating a circuit comprising a switching device, the switching device including a high-voltage depletion mode device and a low-voltage enhancement mode device, the enhancement mode device including a gate, the depletion mode device including a channel, the method comprising:
at a first time, biasing the gate of the enhancement mode device at a voltage lower than a threshold voltage of the enhancement mode device, causing current to flow through the channel of the depletion mode device in a first direction; and
at a second time following the first time, changing the bias on the gate of the enhancement mode device to be higher than the threshold voltage of the enhancement mode device, wherein the current continues to flow through the channel of the depletion mode device in the first direction.

28. The method of claim 27, wherein the high-voltage depletion mode device and the low-voltage enhancement mode device are configured such that the switching device operates as a high-voltage enhancement mode device.

29. The method of claim 28, wherein the depletion mode device comprises a III-N HEMT, and the enhancement mode device comprises a Si MOS device or a III-N HEMT.

30. The method of claim 29, wherein the depletion mode device comprises a III-N HEMT, the enhancement mode device comprises a Si MOS device, the Si MOS device includes an inherent parasitic diode, and the switching device further comprises a Schottky diode connected antiparallel to the Si MOS device.

31. The method of claim 27, wherein changing the bias at the second time reduces conduction loss in comparison to operation between the first time and the second time.

32. The method of claim 27, further comprising at a third time prior to the first time, biasing the gate of the enhancement mode device at a voltage lower than the threshold voltage of the enhancement mode device, causing the depletion mode device to block voltage across the switching device.

33. The method of claim 32, wherein while the depletion mode device blocks voltage across the switching device, the enhancement mode device blocks a voltage at least equal to an absolute value of a threshold voltage of the depletion mode device.

34. The method of claim 27, wherein the circuit is a power-factor correction circuit.

* * * * *

UNITED STATES PATENT AND TRADEMARK OFFICE
CERTIFICATE OF CORRECTION

Page 1 of 2

PATENT NO. : 8,816,751 B2
APPLICATION NO. : 13/959483
DATED : August 26, 2014
INVENTOR(S) : James Honea and Yifeng Wu It is certified that error appears in the above-identified patent and that said Letters Patent is hereby corrected as shown below:

On the Title Page

Page 3, Column 2, References Cited OTHER PUBLICATIONS, at line 7: delete "AlGaN" and insert --AlGaN--;

Page 3, Column 2, References Cited OTHER PUBLICATIONS, at line 10: delete "AlN" and insert --AlN--;

Page 3, Column 2, References Cited OTHER PUBLICATIONS, at line 10: delete "AlGaN" and insert --AlGaN--;

Page 4, Column 2, References Cited OTHER PUBLICATIONS, at line 29: delete "AlGaN" and insert --AlGaN--;

Page 4, Column 2, References Cited OTHER PUBLICATIONS, at line 37: delete "AlGaN" and insert --AlGaN--;

Page 4, Column 2, References Cited OTHER PUBLICATIONS, at line 39: delete "AlGaN" and insert --AlGaN--;

Page 4, Column 2, References Cited OTHER PUBLICATIONS, at line 46: delete "HEMs" and insert --HEMTs--;

Page 4, Column 2, References Cited OTHER PUBLICATIONS, at line 54: delete "AlGaN" and insert --AlGaN--;

Page 4, Column 2, References Cited OTHER PUBLICATIONS, at line 66: delete "AlGaN" and insert --AlGaN--;

Signed and Sealed this
Twenty-first Day of April, 2015

Michelle K. Lee
*Director of the United States Patent and Trademark Office*

CERTIFICATE OF CORRECTION (continued)
U.S. Pat. No. 8,816,751 B2

Page 5, Column 1, References Cited OTHER PUBLICATIONS, at line 2: delete "AlN" and insert --AlN--;

Page 5, Column 1, References Cited OTHER PUBLICATIONS, at line 5: delete "AlGaN" and insert --AlGaN--;

Page 5, Column 2, References Cited OTHER PUBLICATIONS, at line 2: delete "AlN" and insert --AlN--;

Page 5, Column 2, References Cited OTHER PUBLICATIONS, at line 6: delete "interiayers" and insert --interlayers--;

Page 5, Column 2, References Cited OTHER PUBLICATIONS, at line 12: delete "AlGaN" and insert --AlGaN--;

Page 5, Column 2, References Cited OTHER PUBLICATIONS, at line 41: delete "AlGaN" and insert --AlGaN--;

Page 5, Column 2, References Cited OTHER PUBLICATIONS, at line 48: delete "micowave" and insert --microwave--;

Page 5, Column 2, References Cited OTHER PUBLICATIONS, line 50: delete "AlGaN" and insert --AlGaN--; and In the Claims Column 12, line 45, in Claim 30: delete "claim 29" and insert --claim 28--.